United States Patent [19]

Oogita

[11] Patent Number: 4,804,828
[45] Date of Patent: Feb. 14, 1989

[54] CARD-TYPE PROCESSING DEVICE

[75] Inventor: Yoshinori Oogita, Nara, Japan

[73] Assignee: Sharp Kabushiki Kaisha, Osaka, Japan

[21] Appl. No.: 38,206

[22] Filed: Apr. 14, 1987

[30] Foreign Application Priority Data

Apr. 16, 1986 [JP] Japan ............................ 61-56978[U]

[51] Int. Cl.⁴ ............................................. G06C 5/02
[52] U.S. Cl. ............................ 235/1 D; 235/145 R;
200/295; 200/301; 361/399
[58] Field of Search ..................... 235/1 D, 145 R;
200/293, 294, 295, 301, 303, 302.2; 361/390,
394, 398, 399, 401

[56] References Cited

U.S. PATENT DOCUMENTS

| 4,096,577 | 6/1978 | Ferber et al. | 361/398 X |
| 4,596,923 | 6/1978 | Kuo | 235/1 D |
| 4,670,664 | 6/1987 | Hara | 200/5 R X |

Primary Examiner—B. R. Fuller
Attorney, Agent, or Firm—Flehr, Hohbach, Test, Albritton & Herbert

[57] ABSTRACT

A card-type processing device such as an IC card is comprised of an electronic circuit element mounted on a circuit board and a housing which encloses them both inside. The part of the housing which actually encloses the circuit board and the circuit element is rigid but the remaining parts are made flexible such that an internal stress caused by external force is absorbed by the flexible parts and the circuit element is not damaged by the propagating stress.

10 Claims, 2 Drawing Sheets

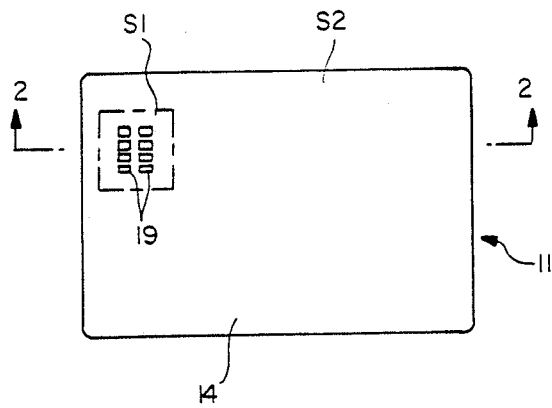
FIG.—1
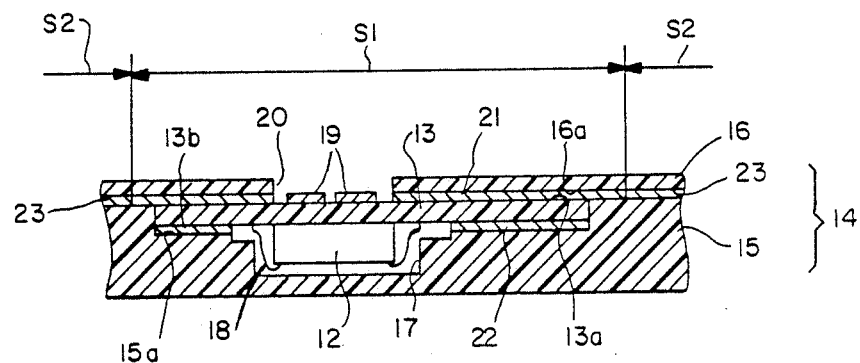
FIG.—2

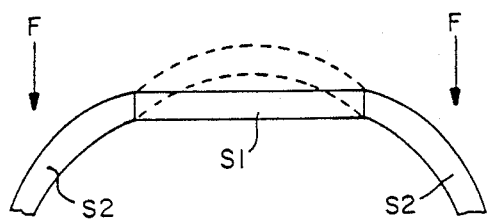
FIG.—3
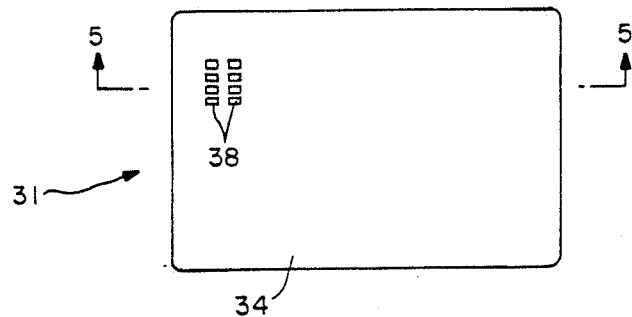
(PRIOR ART)
FIG.—4
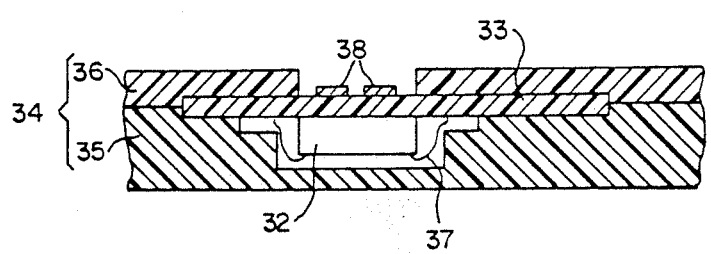
(PRIOR ART)
FIG.—5

CARD-TYPE PROCESSING DEVICE

BACKGROUND OF THE INVENTION

This invention relates to the structure of a card-type processing device such as an IC card and a thin electronic calculator.

An IC card 31 of a conventional type, as shown in FIG. 4 which is its plan view and FIG. 5 which is its sectional view taken along the line 5-5 of FIG. 4, includes a printed circuit board 33 with an LSI chip 32 mounted thereon and a housing 34 which encloses this circuit board 33. The housing 34 is comprised of a lower plate 35 and an upper plate 36 made of vinyl chloride or the like. The LSI chip 32 is electrically connected to the printed circuit board 33 by way of bonding wires 37. On the side of the printed circuit board 33 opposite from the LSI chip 32, there are connecting terminals 38 mounted thereon, exposed to the exterior. These connecting terminals 38 are for making electrical connections to an electronic device such as a portable reader/writer so that data can be exchanged between the IC card 31 and such a device to which it is connected.

To fabricate an IC card structured as described above, the connecting terminals 38 are formed first on the printed circuit board 33 and the LSI chip is then mounted thereonto. The printed circuit board 33, together with the LSI chip 32 mounted thereon, is buried between the lower and upper plates 35 and 36 and their inner surfaces are joined together by a thermal press.

The prior art IC card 31 thus manufactured is uniform throughout its body in material strength. If the user sits down on a chair with such a card in his hip pocket, therefore, a strong local stress is developed and such a stress propagates throughout the card. The LSI chip 2 thereby experiences a bending and/or sharing stress and a severe damage may be sustained.

SUMMARY OF THE INVENTION

It is therefore an object of the present invention to provide a card-type processing device such as an IC card which can absorb a local stress and prevent it from propagating to the electronic circuit element mounted thereon, thereby preventing damage to such a circuit element.

The above and other objects of the present invention are achieved by providing a card-type processing device comprising a circuit board with an electronic circuit element mounted thereon and enclosed inside a card-type housing which is rigid where it encloses the circuit board but is flexible elsewhere. With the housing structured in this manner, a local stress which may be generated in the housing is absorbed by the flexible part and does not propagate to the circuit element.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a plan view of an IC card embodying the present invention,

FIG. 2 is a sectional view of the IC card of FIG. 1 taken along the line 2-2 of FIG. 1, FIG. 3 is a drawing for showing the effect of a local stress developed in an IC card of the present invention, FIG. 4 is a plan view of a prior art IC card, and FIG. 5 is a sectional view of the prior art IC card of FIG. 4 taken along the line 5-5 thereof.

DETAILED DESCRIPTION OF THE INVENTION

With reference to FIGS. 1 and 2, an IC card 11 embodying the present invention is comprised of an LSI chip 12, a printed circuit board 13 on which this LSI chip 12 is mounted and a card-type housing 14 which encloses the LSI chip 12 and the printed circuit board 13. The housing 14 is comprised of a lower plate 15 and an upper plate 16, both made of vinyl chloride or the like. The lower plate 15 is formed with an indentation 17 for containing the LSI chip 12 therein.

The LSI chip 12 is electrically connected to the printed circuit board 13 by way of bonding wires 18. Connecting terminals 19 are formed on the side of the printed circuit board 13 opposite from the LSI chip 12. These connecting terminals 19 are exposed to the exterior through an opening 20 formed in the upper plate 16. The connecting terminals 19 serve to be electrically connected to an electronic device such as a portable reader/writer so that desired data processing can be performed by exchanging data between the IC card and the device to which it is connected.

A thermosetting tape 21 is inserted between the upper surface 13a of the printed circuit board 13 and the inner surface 16a of the upper plate 16, protruding slightly outward from the periphery of the printed circuit board 13. Another thermosetting tape 22 is inserted between the lower surface 13b of the printed circuit board 13 and the inner surface 15a of the lower plate 15. These thermosetting tapes 21 and 22 serve to affix the printed circuit board 13 to the upper plate 16 and the lower plate 15. The part S1 of the housing 14 stuck together by these tapes 21 and 22 is of a rigid structure. For the remaining parts S2 of the housing 14, the lower plate 15 and the upper plate 16 are stuck together by means of an adhesive tape 23. This allows the contacting surfaces of the plates 15 and 16 to slip with respect to each other in these parts S2 to make the card flexible. When a local stress is generated in the IC card 11 by an external force F, it may typically look as shown in FIG. 3. Since the card 11 has both a rigid part S1 and flexible parts S2, the stress operates on the flexible parts S2, causing them to bend as shown. The internal stress is thus absorbed by the flexible parts S2 ad hardly has any effect on the rigid part S1. The broken lines in FIG. 3 show how the part S1 would bend if the card 11 were structured in the conventional way. With the rigid part S1 relatively unaffected by the external force F and the stress caused thereby, damage to the LSI chip 12 by such a stress can be prevented.

The foregoing description of a preferred embodiment of the invention has been presented for purposes of illustration and description. It is not intended to be exhaustive or to limit the invention to the precise form disclosed, and many modifications and variations are possible in light of the above teaching. For example, although the present invention has been described above by way of an IC card, it is equally applicable to other types of devices such as electronic calculators. Such modifications and variations that may be apparent to a person skilled in the art are intended to be included within the scope of this invention.

What is claimed is:

1. A card-type processing device comprising a circuit board with electronic circuit elements mounted thereon and a planar housing structure with a central part which is rigid and enclosingly contains said circuit board and a peripheral part which is flexible and surrounds said central part.

2. The device of claim 1 wherein said housing structure includes an upper plate and a lower plate attached to each other in a face-to-face relationship.

3. The device of claim 2 further comprising in said central part a first thermosetting tape sandwiched between said circuit board and said upper plate and a second thermosetting tape sandwiched between said circuit board and said lower plate.

4. The device of claim 3 further comprising an adhesive tape sandwiched between said upper and lower plates in said peripheral part.

5. The device of claim 2 wherein said lower plate is formed with an indentation, said electronic circuit elements being disposed inside said indentation.

6. The device of claim 4 wherein said adhesive tape allows said upper and lower plates to slide with respect to each other.

7. The device of claim 3 wherein said thermosetting tapes are attached firmly to said circuit board and said upper and lower plates so as to form together a rigid structure.

8. The device of claim 2 wherein said upper and lower plates comprise vinyl chloride.

9. The device of claim 1 wherein said circuit board is contained only in said central part.

10. The device of claim 1 wherein said peripheral part is adapted to absorb propagating stress through said housing structure when an external force is applied thereon.

* * * * *